United States Patent [19]

Faria et al.

[11] 4,254,093

[45] Mar. 3, 1981

[54] SOLAR ENERGY GRADE CADMIUM SULFIDE

[75] Inventors: Sixdeniel Faria; Vincent Chiola, both of Towanda, Pa.

[73] Assignee: GTE Products Corporation, Stamford, Conn.

[21] Appl. No.: 740,208

[22] Filed: Nov. 9, 1976

[51] Int. Cl.$^3$ .................... C01B 17/00; H01L 31/00; H01B 1/06

[52] U.S. Cl. ................ 423/561 B; 136/260; 252/501.1; 252/518; 252/62.3 ZT

[58] Field of Search ................ 423/561, 509; 252/62.3 ZT, 501; 23/294

[56] References Cited

U.S. PATENT DOCUMENTS

| | | | |
|---|---|---|---|
| 2,890,939 | 6/1959 | Ravich | 423/561 B |
| 3,065,515 | 11/1962 | Antes | 423/561 B |
| 3,362,795 | 1/1968 | Weisbeck | 423/561 B |

OTHER PUBLICATIONS

Czyzak et al., Cadmium Sulfide Crystals, J. of Applied Physics, vol. 23, Aug. 1952, pp. 932-933.
Cherin et al., Cadmium Zinc Sulfide Solid Solutions, J. of American Electrochemical Society, vol. 117, No. 2, 1970, pp. 233-236.

*Primary Examiner*—O. R. Vertiz
*Assistant Examiner*—Gary P. Straub
*Attorney, Agent, or Firm*—John C. Fox

[57] ABSTRACT

A composition consisting essentially of discrete particles of cadmium sulfide that are relatively free of anionic, cationic and volatile impurities has an average particle size of from about 8 to about 25 micrometers and a bulk density of from about 1.7 to about 1.9 grams per cubic centimeter and has superior properties for use in solar energy applications. The composition is prepared by forming a finely-divided impure cadmium sulfide by chemical precipitation, heating the resulting precipitate to an intermediate temperature in a flow of an inert gas, heating the material at an elevated temperature in a flowing sulfide atmosphere selected from hydrogen sulfide and carbon disulfide and cooling the heated material in a sulfide atmosphere to about the intermediate temperature and cooling to ambient temperature in an inert gas.

2 Claims, 2 Drawing Figures

SOLAR ENERGY GRADE CADMIUM SULFIDE

BACKGROUND OF THE INVENTION

1. Field of the Invention

This invention relates to solar energy grade cadmium sulfide. More particularly, it relates to cadmium sulfide having advantageous particle size, bulk density and purity to enable the material to be effectively used for solar energy devices and to a process for producing the improved cadmium sulfide.

2. Prior Art

Cadmium sulfide is known in the art and photovoltaic cells made therefrom can have an efficiency that compares favorably with silicon. There has been a problem heretofore in obtaining a material that can be deposited satisfactorily upon a suitable substrate to achieve good adherence and a high quality. Cadmium sulfide, when of satisfactory purity, has been very finely divided, e.g., below 0.5 micrometers with an average agglomerated size of about 2 micrometers. This fine aggregate had to be pelletized before it could be satisfactorily deposited by sublimation upon a substrate. Normally vacuum systems are used and as a consequence the finely divided material before pelletization was completely unsatisfactory. Furthermore, prior art cadmium sulfide contained a relatively high concentration of volatile impurities of organic and inorganic origin. The impurities result in lower deposition efficiency, poor adhesion (bonding) and lower conversion efficiency as well as contributing to maintenance problems in the vacuum processing equipment.

A free-flowing cadmium sulfide material having an average particle size of from about 8 to about 25 micrometers and having less than about 1% of the particles below about 5 micrometers and having a low level of anionic, cationic and volatile impurities would be an advancement in the art.

OBJECTS AND SUMMARY OF THE INVENTION

It is an object of this invention to provide a free-flowing cadmium sulfide particularly suitable for solar energy applications.

It is another object of this invention to provide a relatively pure cadmium sulfide having relatively large particles to thereby improve the deposition characteristics of the material.

It is a further object of this invention to provide a solar energy grade cadmium sulfide having improved photovoltaic properties applied on a substrate for a solar energy device.

It is still another object of this invention to provide a process for producing a highly pure, relatively large particle size, solar energy grade cadmium sulfide.

These and other objects of this invention are achieved in one aspect of the invention comprising discrete particles of cadmium sulfide having an average particle size of from about 8 to about 25 micrometers, with less than about 1% having a particle size of less than about 5 micrometers, a bulk density of from about 1.7 to about 1.9 grams per cubic centimeter, below about 150 ppm of anionic impurities, below about 20 ppm of cationic impurities and below about 100 ppm of volatile impurities, said cadmium sulfide being essentially all hexagonal cadmium sulfide.

In another aspect of this invention, a chemically precipitated luminescent grade cadmium sulfide is treated by a flowing stream of an inert gas at an intermediate temperature, thereafter the temperature is raised to a relatively high temperature while treating with a sulfide gas atmosphere selected from hydrogen sulfide and carbon disulfide, cooling the cadmium sulfide material to about the intermediate temperature in the sulfide atmosphere and thereafter cooling to ambient temperature in an inert gas. Time and temperature conditions during the foregoing heating and cooling cycles are closely controlled.

DETAILS OF THE PREFERRED EMBODIMENTS

Figure 1:
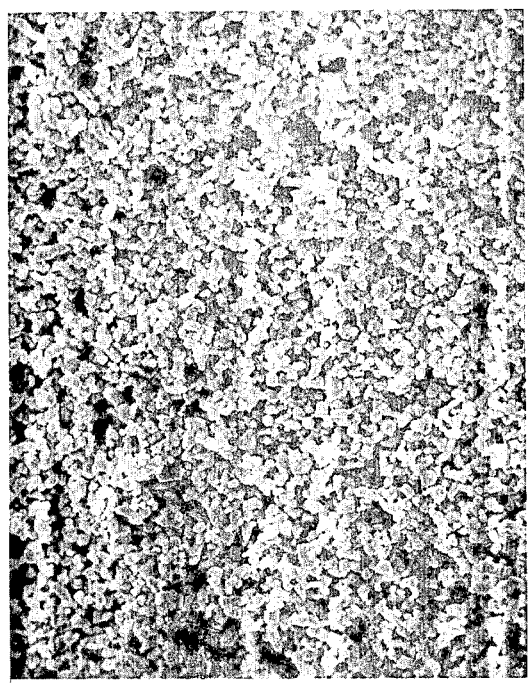
FIG. 1 is a photomicrograph at 1000 magnifications of the prior art cadmium sulfide.

For a better understanding of the present invention, together with other and further objects, advantages and capabilities thereof, reference is made to the following disclosure and appended claims in connection with the above-described drawings.

Processes for precipitation of luminescent grade cadmium sulfide are well-known. Typical processes are described in Appendix I of a book entitled: "An Introduction of Luminescence of Solids" by Humboldt W. Leverenz, John Wiley & Sons, Inc., New York (1950). As is shown, the normal procedure is to dissolve a cadmium salt in water, preferably the chloride or sulfate, then bubble hydrogen sulfide through the solution to precipitate essentially all of the cadmium in the form of cadmium sulfide. While the yield of cadmium sulfide is quite high, anionic and cationic impurities from the sources of cadmium and hydrogen sulfide gas are occluded or co-precipitated with the cadmium sulfide. Purification to reduce the impurities involves extensive washing and leaching. Even after the above purification, the cadmium sulfide so produced is not pure enough for solar energy uses. Generally, the material after purification has an average particle size below about 0.5 micrometers with the largest agglomerate being about 2 micrometers.

By the process of this invention, it is possible to upgrade the foregoing luminescent grade cadmium sulfide to solar energy grade cadmium sulfide. As used herein, the term "luminescent grade cadmium sulfide" means a material that is at least 97% by weight cadmium sulfide and the balance anionic and cationic impurities with a zinc content below about 20 ppm by weight.

By the process of this invention as hereinafter described, the luminescent grade cadmium sulfide is converted to solar energy grade cadmium sulfide which contains discrete particles of cadmium sulfide consisting essentially of greater than 99.9% by weight of hexagonal crystal cadmium sulfide with anionic impurities below about 150 ppm, cationic impurities below about 20 ppm and volatile impurities below 100 ppm. For the purposes of this disclosure, "volatile" means a material that will vaporize below 400° C. The average particle size varies from about 8 to about 25 micrometers as measured by the Fisher subsieve sizer. Coulter counter measurements show that typically 100% of the particles are above 5 micrometers, with greater than 98% being greater than 7.5 micrometers.

The process of this invention comprises a first thermal treatment step in an inert gaseous atmosphere and a second thermal treatment step in a hydrogen sulfide or carbon disulfide atmosphere. After the thermal treatment steps the treated cadmium sulfide is subjected to a dual phase cooling cycle. In the first phase the cadmium sulfide is cooled to an intermediate temperature in the presence of the sulfide gas atmosphere and then in the second phase the cadmium sulfide is cooled from the intermediate to ambient temperature in an inert gas atmosphere.

In the first thermal treatment step any inert gas such as nitrogen, argon or any of the other inert gases can be used. Nitrogen is preferred because of cost, availability, and purity. The precipitated or luminescent grade cadmium sulfide is heated to about 450° C. to about 550° C. in a reactor while being flushed with the inert gas. The temperature is maintained at about 450° C. to about 550° C. for about 1 to 2 hours. The gaseous atmosphere is then changed to hydrogen sulfide and the temperature of the reactor is raised to about 1000° C. to about 1100° C. and maintained at the higher temperature for about ½ hour to 1 hour. The temperature is lowered to a range of from about 450° C. to about 550° C. while maintaining the hydrogen sulfide atmosphere and then is cooled to ambient temperature using an inert gaseous atmosphere. The cooling cycle is generally completed within about 2 hours. The flow rates of the gas during the thermal treatment steps will vary depending upon the quantity of cadmium sulfide being processed. A gas flow rate of from about 0.5 to about 30 ft.$^3$/hr./pound of cadmium sulfide is suitable.

The following detailed example is presented to illustrate the invention. All parts, proportions and percentages are in weight unless otherwise stated.

EXAMPLE I

About 3 pounds of luminescent grade cadmium sulfide is placed in a quartz tube reactor and a flow of nitrogen at about 9 ft.$^3$/hr. is maintained while the temperature is raised to about 500° C. The temperature is maintained at 500° C. for about 1 hour. Hydrogen sulfide at a flow rate of 4 ft.$^3$/lhr. is used to replace nitrogen and the temperature in the reactor is raised to about 1000° C. The material is held at about 1000° C. for about 0.5 hour, thereafter it is cooled to about 500° C. under the hydrogen sulfide flow. The hydrogen sulfide is shut off and nitrogen is introduced while cooling the material to ambient temperature. Table I below gives the analysis of the luminescent starting material and the solar energy grade material after the treatment.

TABLE I

|  | Luminescent CdS | Solar Energy CdS |
|---|---|---|
| Cu | 0.42 ppm | 0.23 ppm |
| Mn | 1.10 ppm | 1.00 ppm |
| Pb | 2.70 ppm | 2.10 ppm |
| Zn | 24.00 ppm | <10.00 ppm |
| Fe | 0.59 ppm | <0.40 ppm |
| Ni | 1.10 ppm | <0.71 ppm |
| Cl$^-$ | 2.35% | <0.005% |
| H$_2$O | 0.05% | <0.01% |
| SO$_4$$^=$ | 0.02% | <0.01% |

FIG. 1 is a photomicrograph of the luminescent grade cadmium sulfide heretofore used. As can be seen, the particle size is very small which causes handling problems.

Figure 2:
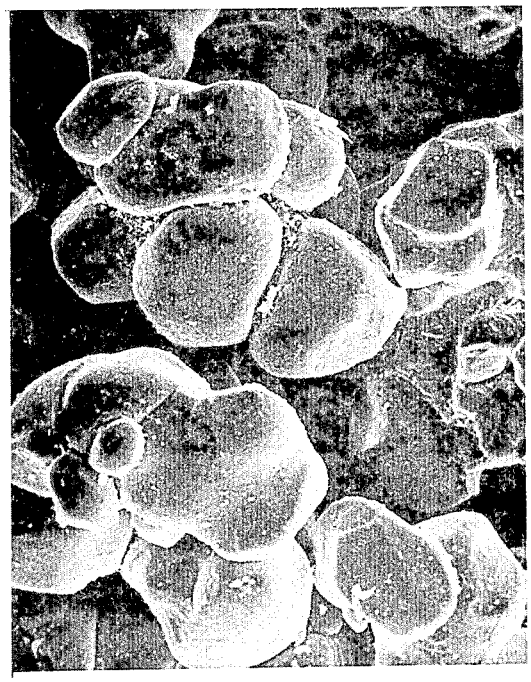
FIG. 2 is a photomicrograph at 1000 magnifications of the cadmium sulfide of this invention.

FIG. 2 is a photomicrograph of the product of this invention and the particle size enables it to be used easily in the production of solar energy devices. X-ray diffraction patterns of the starting material and the treated material of this invention show that essentially all of the cadmium sulfide in the material of this material is hexagonal cadmium sulfide whereas in the prior art material a major portion did not have a hexagonal crystal structure.

The impurities in the treated material are as follows:
   Anionic: 150 ppm
   Cationic: 20 ppm
   Volatile: 100 ppm While there has been shown and described what are at present considered the preferred embodiments of the invention, it will be obvious to those skilled in the art that various changes and modifications may be made therein without departing from the scope of the invention as defined by the appended claims.

What is claimed is:

1. A solar energy grade cadmium sulfide composition consisting essentially of discrete particles of hexagonal cadmium sulfide, having an average particle size of from about 8 to about 25 micrometers, a bulk density of from about 1.7 to about 1.9 grams per cubic centimeter, below about 150 ppm of anionic impurities, below about 20 ppm of cationic impurities and below about 100 ppm of volatile impurities.

2. A composition according to claim 1 wherein said composition has less than about 1% by weight of the particles below 5 micrometers.

* * * * *